United States Patent [19]
Kang

[11] Patent Number: 6,031,261
[45] Date of Patent: Feb. 29, 2000

[54] SILICON-ON-INSULATOR-DEVICE AND FABRICATION METHOD THEREOF

[75] Inventor: Chang Yong Kang, Chungcheongbuk-do, Rep. of Korea

[73] Assignee: LG Semicon Co., Ltd., Chungcheongbuk-do, Rep. of Korea

[21] Appl. No.: 09/124,033

[22] Filed: Jul. 29, 1998

[30] Foreign Application Priority Data

Dec. 15, 1997 [KR] Rep. of Korea ............ 97-68703

[51] Int. Cl.⁷ .................................................. H01L 29/72
[52] U.S. Cl. ................. 257/302; 257/347; 257/351; 257/401; 438/270; 438/300; 438/480; 438/694
[58] Field of Search ................... 257/302, 347, 257/351, 401; 438/270, 300, 480, 694

[56] References Cited

U.S. PATENT DOCUMENTS 5,869,847  2/1999  Sin et al. .......................... 257/347

OTHER PUBLICATIONS

Solid State Electronics vol. 34 No. 10 1991. pp. 1071–1075
IEDM 91. pp. 667–670.

*Primary Examiner*—Edward Wojciechowicz

[57] ABSTRACT

A two-layer buried oxide enables fabrication of a silicon-on-insulator MOSFET with thick-film source/drain regions and a thin-film channel region. After a hole has been etched in the substrate above a first buried oxide layer (i.e., in the upper substrate), oxygen is implanted to form a second buried layer within the substrate below the first buried layer (i.e., within the lower substrate). After a hole (aligned with the hole through the upper substrate) has been etched in the first buried layer, p-type dopants are implanted to form upper doped regions within the upper substrate to either side of the holes and a lower doped region within the lower substrate below the holes but above the second buried layer. An epitaxial layer roughly as thick as first buried layer is grown on the upper and lower substrates, a conformal insulating film is deposited onto the epitaxial layer, and a gate electrode is formed on the on the insulating film. Implantation of n-type dopants into both the epitaxial layer and the upper substrate to either side of the holes completes fabrication of the silicon-on-insulator device.

20 Claims, 6 Drawing Sheets

SILICON-ON-INSULATOR-DEVICE AND FABRICATION METHOD THEREOF

BACKGROUND OF THE INVENTION

1. Field of the Invention

The present invention relates to a silicon-on-insulator semiconductor device and, more particularly, to an silicon-on-insulator metal-oxide-semiconductor field effect transistor (MOSFET) and also to a method of fabricating the device.

2. Discussion of the Related Art

The term silicon-on-insulator collectively refers to device isolation technologies through which a device fabricated on a silicon substrate is electrically isolated from other devices on the substrate by means of an insulating region bordering the device. Although the origin of silicon-on-insulator technologies may be traced back to a 1934 German patent issued to Oscar Heil, silicon-on-insulator substrates escaped categorization as exotic materials only in the 1980's and were introduced into high-volume production for a limited range of applications only in the early 1990's. Of the many processes that were proposed during the 1980's for fabricating thin-film silicon-on-insulator structures, only SIMOX (Separation by IMplanted OXygen) processes appears to have survived scale-up to high-volume production.

SIMOX processes, in which a buried layer of $SiO_2$, is created within a silicon substrate by implanting oxygen into the substrate and then annealing the substrate, require implantation of a dose of oxygen ions (typically b $1-2\times10^{18}cm_{-2}$) high enough to ensure that a continuous layer (i.e., a layer without holes which is sufficiently thick and of sufficiently high quality to electrically isolate the device which it borders) of stoichiometric $SiO_2$ is formed by chemical reaction of implanted oxygyen with bulk silicon during the annealing process. (A lower dose of nitrogen ions may alternatively be implanted in lieu of oxygen ions in order to form a continuous layer of stoichiometric $Si_3N_4$.) The energy of the implant must also be sufficiently high (typically 150–200 keV) to ensure that the peak of the implant is sufficiently deep (typically 0.3–0.5 $\mu$m) within the substrate to enable device fabrication on the silicon layer that lies above the buried oxide layer.

A post-implant anneal is performed in an inert ambient for a time interval long enough (typically 3–6 hours) and at a temperature high enough (typically 1200–1400° C.) to form the continuous buried layer of stoichiometric $SiO_2$. In addition to driving the chemical reaction of silicon and oxygen, the anneal facilitates diffusion of unreacted oxygen out of the substrate, thereby increasing the dielectric breakdown strength of the buried oxide layer, and also repair of the region of the crystalline substrate through which the oxygen beam has passed.

After the anneal, the crystalline silicon layer above the buried oxide layer is typically only 100–300 nm thick. Growth of an additional layer of epitaxial silicon would thus be necessary for structures that require thicker single-crystal device regions. Thin-film MOS devices fabricated on a silicon-on-insulator substrate do, however. have several important advantages over devices fabricated on a thicker layer of single-crystal silicon. Long-channel behavior can be preserved for gate lengths well below half a micron because the source/drain depletion regions can obviously extend into the thin film only until they reach the buried oxide layer. Few hot-carriers (i.e., carriers whose energy distribution is shifted to a much higher mean energy than that of carriers which are in thermal equilibrium with the lattice) are generated in such fully-depleted silicon-on-insulator MOSFETs on account of the significantly reduced lateral electric field near the drain edge of the channel.

The performance of thin-film MOSFETs suffer, however, from parasitic effects, notably high sheet resistance of and high contact resistance to the thin film source/drain regions. In addition, MOSFET structures fabricated on silicon-on-insulator substrates are subject to floating-body effects, which occur because the body of the active (device) region of the silicon-on-insulator substrate (ie., the region of the substrate above the buried oxide layer) is not easily held at a constant potential, in contrast to the body of a bulk single-crystal silicon substrate (i.e., a substrate without a buried oxide layer), the back surface of which can easily be grounded. For example, channel electrons in an n-channel MOSFET operating in the saturation region of the $I_{DS}$–$V_{DS}$ characteristics generate electron-hole pairs by impact ionization near the drain region. Absent a grounded body contact, the holes thereby generated would flow towards the source region and increase the substrate potential, which increase would be reflected in an abrupt rise in the $I_{DS}$–$V_{DS}$ characteristics.

Figure 1:
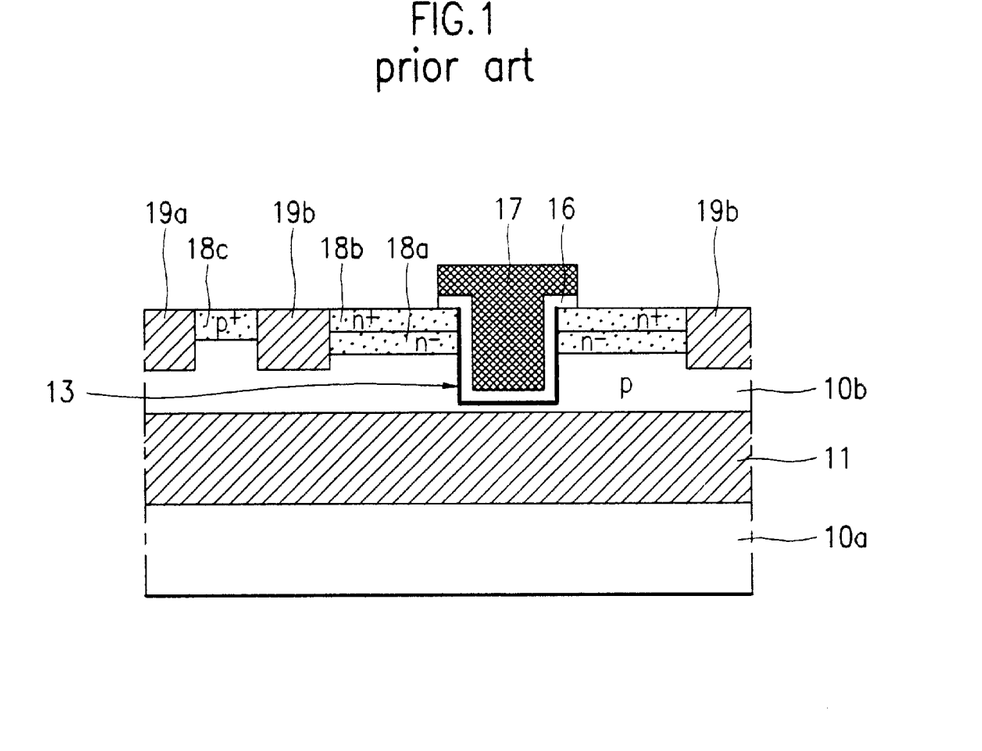
FIG. 1 is an idealized cross-sectional view of a conventional silicon-on-insulator MOSFET which has thick-film source/drain regions and a thin-film channel region.

An interesting approach to ameliorating floating body effects in a MOSFET fabricated on a silicon-on-insulator substrate was disclosed by K. Hieda, et al. in *Floating-Body Effect Free COncave Silicon-on-insulator-MOSFETs* (*COSMOs*), which appeared at pp. 667–670 of the *Technical Digest* of the *IEEE International Electron Devices Meeting* held Dec. 8–11, 1991 in Washington, D.C. As shown in the idealized cross-sectional view of FIG. 1, the silicon-on-insulator MOSFET of Hieda, et al. includes:

a lightly-doped, p-type silicon substrate 10 having a trench 13;

a first trench isolation structure 19a within the substrate to a first side of the trench 13;

second trench isolation structures 19b within the substrate to either side of the trench 13, a second trench isolation structure between the trench 13 and the first trench isolation structure 19a;

a conformal gate insulator 16 which lines the trench and thus defines a lined trench;

a gate electrode 17 on the gate insulator 16. which gate electrode fills the lined trench;

lightly-doped, n-type source/drain regions 18a within the substrate to either side of the trench 13, each lightly-doped source/drain region 18a between the trench 13 and a second trench isolation structure 19b;

heavily-doped, n-type source/drain regions 18b within the substrate to either side of the trench 13, each heavily-doped source/drain region 18b above a lightly-doped source/drain region 18a;

a heavily-doped, p-type body-contact region 18c within the substrate between the first trench isolation structure 19a and the second trench isolation structure 19b to the first side of the trench 13; and a continuous, substantially planar buried silicon dioxide layer 11 within the substrate, which buried layer separates an upper region 10b of the substrate from a lowser region 10a of the substrate and which also bounds from below the first trench isolation structure 19a, the second trench isolation structures 19b, and the trench 13.

The trench 13 is said to be bounded from below by the buried layer 11, since the upper boundary of the buried layer under any given point on the surface of the substrate lies below the lower boundary of the trench under that given point.

The heavily-doped, p-type region 18c of Hieda, et al. is referred to as the body-contact region of the silicon-on-insulator MOSFET, since it provides a low-resistance, electrically conductive path between ground and the upper substrate 10b. Since, as mentioned briefly above, the electrostatic potential of the body would float were it not for an electrically conductive path, the body contact region 18c reduces floating-body effects. The MOSFET structure of Hieda, et al. also provides thick-film source/drain regions 18a and 18b, which facilitate formation of low-resistance electrical contacts to the source/drain regions, and a thin-film channel (i.e., the region of the upper substrate 10b between the bottom of the trench 13 and the buried oxide layer 11), which forestalls the onset of short-channel effects and suppresses the generation of hot electrons.

Notwithstanding the several advantages of the silicon-on-insulator MOSFET structure of Hieda, et al. seen in simulation, such advantages would not easily be realized in practice, since the structure would be very difficult to fabricate. More specifically, the structure of Hieda, et al. provides no etch stop indicator which could be employed during the course of etching the trench 13, the single most important feature of the structure.

SUMMARY OF THE INVENTION

An object of the present invention is thus to provide a silicon-on-insulator MOSFET structure having thick-film source/drain regions and a thin-film channel region, but which can be realized in fabrication as well as in simulation. The method of the present invention includes a counterintuitive process step of etching a hole through a first buried oxide layer in order to form a novel two-layer buried oxide that enables fabrication of a silicon-on-insulator MOSFET with the desired thick-and thin-film features.

After a hole has been etched through the substrate above the first buried oxide layer (i.e., in the upper substrate), oxygen is implanted to form a second buried layer within the substrate below the first buried layer (i.e., within the lower substrate). After a hole (aligned with the hole through the upper substrate) has been etched through the first buried layer, p-type dopants are implanted to form upper doped regions within the upper substrate to either side of the holes and a lower doped region within the lower substrate below the holes but above the second buried layer. An epitaxial layer roughly as thick as first buried layer is grown on the upper and lower substrates, a conformal insulating film is deposited onto the epitaxial layer over the lower doped region, and a conductive layer is formed on the insulating film. Implantation of n-type dopants into both the epitaxial layer and the upper substrate to either side of the holes completes fabrication of the silicon-on-insulator device of the present invention.

BRIEF DESCRIPTION OF THE DRAWINGS

None of the figures briefly described below are drawn to scale. As is common in the art of integrated circuit representation, the thicknesses and lateral dimensions of the various structures shown in the figures were chosen only to enhance the legibility of the figures.

DETAILED DESCRIPTION OF THE PREFERRED EMBODIM9IENTS

Figure 2:
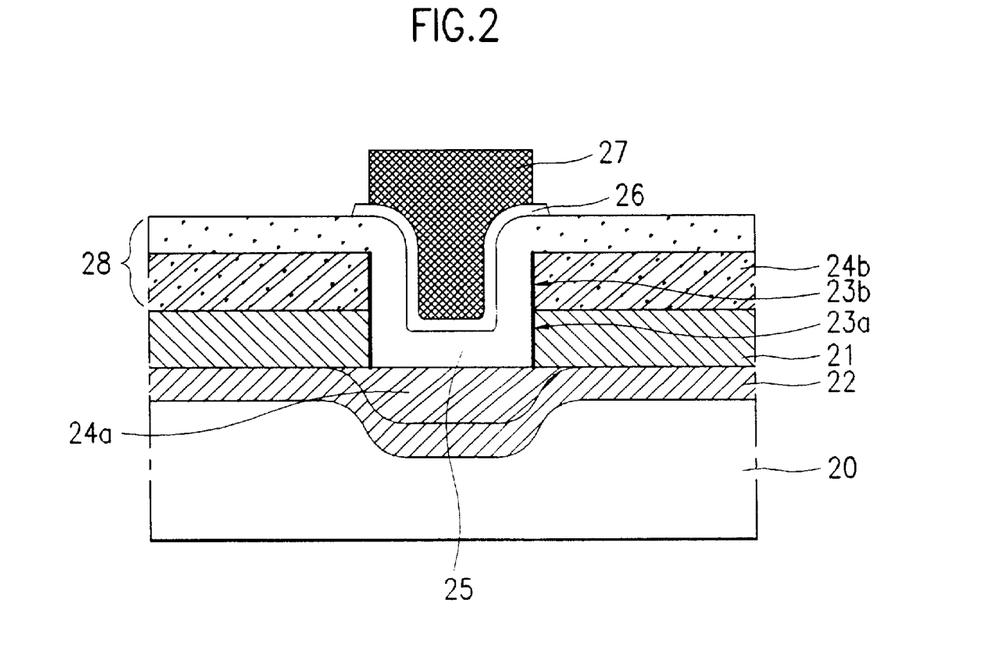
FIG. 2 is an idealized cross-sectional view of a silicon-on-insulator MOSFET according to an embodiment of the present invention.

As shown in the idealized cross-sectional view of FIG. 2, the silicon-on-insulator MOSFET of the present invention includes:

a silicon substrate 20;

a continuous, substantially planar first buried insulating layer 21 within the substrate, which first buried layer preferably consists of either silicon dioxide ($SiO_2$) or silicon nitride ($Si_3N_4$) and defines an upper region 20b of the substrate above the first buried layer (hereinafter referred to as the upper substrate 20b) and a lower region 20a of the substrate below the first buried layer (hereinafter referred to as the lower substrate 20a), where the upper substrate has a hole 23b and the first buried layer has a hole 23a substantially aligned with the hole through the upper substrate;

a lower doped reuion 24a of a first conductivity type within the lower substrate 20a below the hole 23a through the first buried layer;

a continuous second buried insulating layer 22 within the lower substrate 20a, which second buried layer preferably consists of either silicon dioxide ($SiO_2$) or silicon nitride ($Si_3N_4$) and bounds from below the lower doped region 24a;

upper doped regions 24b of the first conductivity type within the upper substrate to either side of the hole 23b through the upper substrate;

an epitaxial layer 25 on the upper substrate and on the lower substrate above the lower doped region, where regions of the epitaxial layer above the lower doped region define a a trench;

doped regions 28 of a second conductivity type within both the epitaxial layer 25 and the upper substrate 30a to either side of the trench;

a conformal insulating film 26 on the epitaxial layer which insulating film lines the trench and thus defines a lined trench;

a gate electrode layer 27 on the conformnal insulating film, which gate electrode fills the lined trench; and a heavily-doped body contact region (not shown) of the first conductivity type within the lower doped region 24a.

(The body contact region does not appear in FIG. 2 because the cross-sectional view of FIG. 2 shows only regions of the lower doped region below the gate electrode. A cross-sectional view which would show the body contact region would thus be out-of-the-page or into-the-page with respect to the cross-sectional view of FIG. 2.)

Process steps of a method of fabricating the silicon-on-insulator MOSFET shown in FIG. 2 are described immediately below with reference to the idealized cross-sectional views of FIGS. 3A–3I.

Figure 3A:
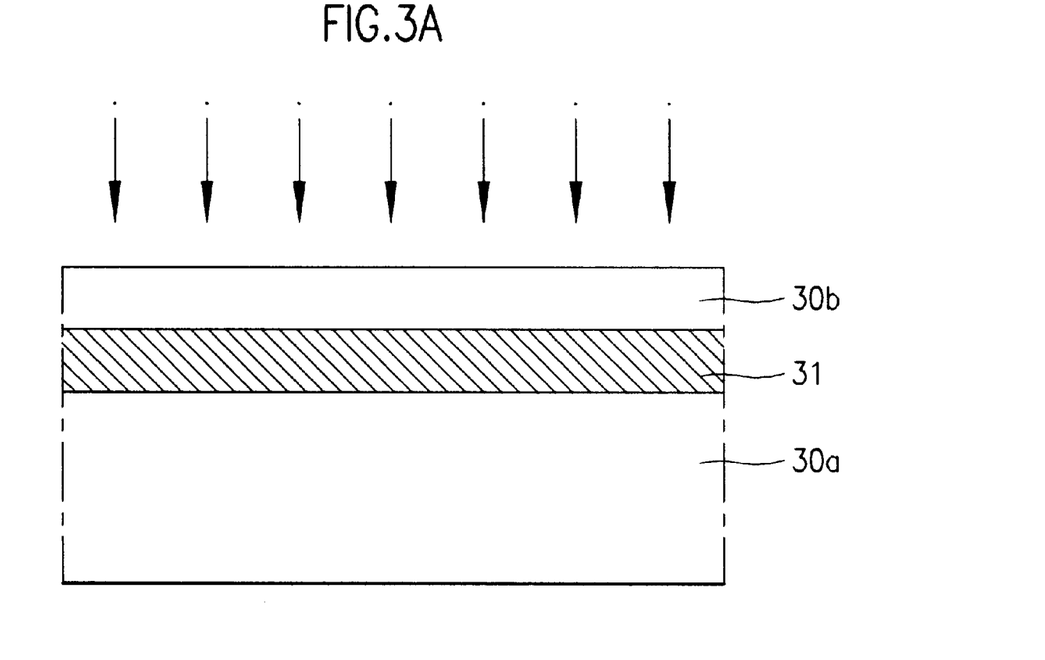
FIGS. 3A–3I are idealized cross-sectional views illustrating process steps of a method of fabricating the silicon-on-insulator MOSFET shown in FIG. 2 according to an embodiment of the present invention.

After formation of isolation structures (not shown) define field and active regions of an undoped silicon substrate 30, oxygen (nitrogen) is implanted into the active regions and the substrate is annealed to form a continuous, substantially planar, first buried silicon dioxide layer (silicon nitride layer) 31 within the substrate, as shown in FIG. 3A. (The silicon-on-insulator MOSFET of the present invention could and, in practice, probably would be fabricated on a silicon-on-insulator substrate that included a continuous, substantially planar buried insulating layer, rather than on the bulk silicon substrate which is the starting material for the process step described immediately above. Such silicon-on-insulator starting material would clearly obviate the process step described immediately above and illustrated in FIG. 3A.) For economy of expression, we refer to either the oxide layer or the nitride layer as the first buried insulating layer 31 or, more economically still, the first buried layer 31. Formation of the first buried layer 31 defines a region 30b of the substrate above the first buried layer (hereinafter referred to as the upper substrate 30b) and a region 30a of the substrate below the first buried layer (hereinafter referred to as the lower substrate 30a).

Figure 3B:
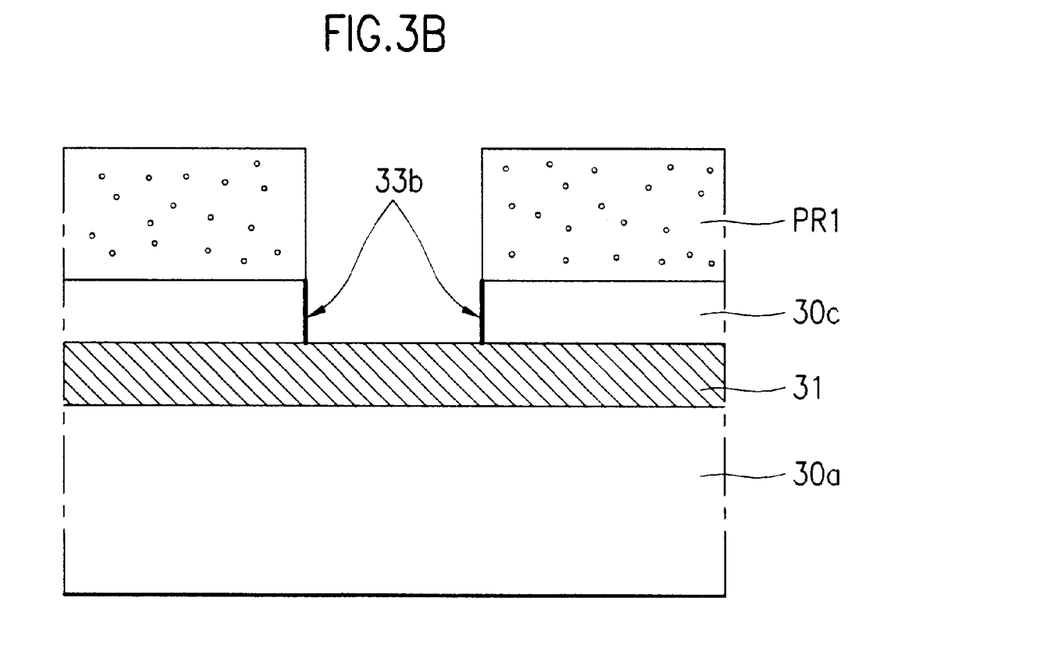

A photoresist coating is spun onto the upper substrate and patterned by means of well-known exposure and development process steps to form a first photoresist pattern PR1. Masked by the first photoresist pattern PR1, the upper substrate 30b is selectively etched until an area of the first buried layer 31 is exposed, as shown in FIG. 3B. Etching the upper substrate 30b also exposes lateral surfaces 33b of the upper substrate, which collectively define a hole through the upper substrate, and thereby forms an etched upper substrate 30c.

Figure 3C:
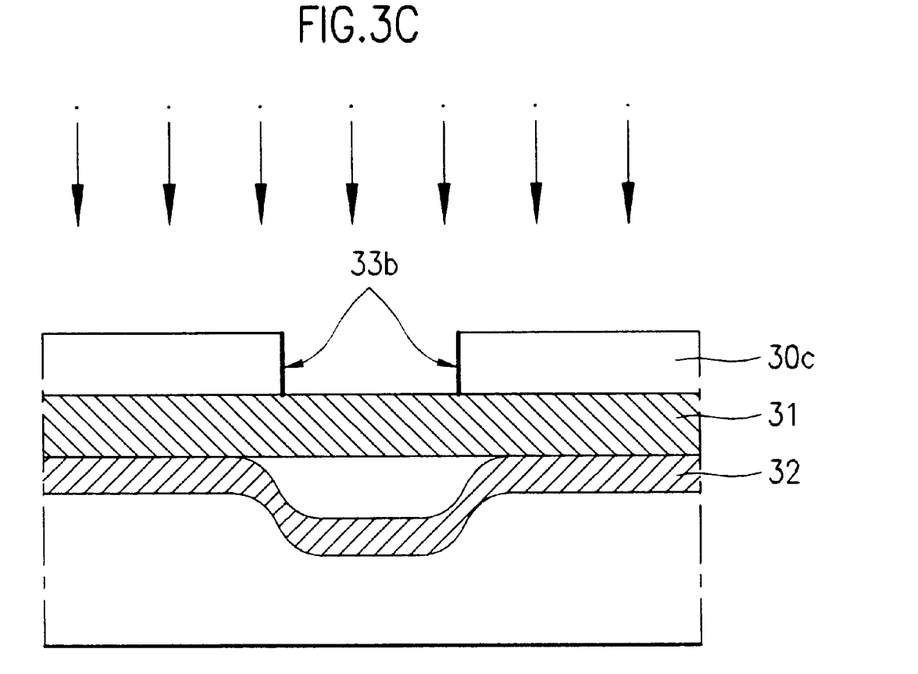

After the first photoresist pattern PR1 has been stripped, oxygen (nitrogen) is implanted into the substrate and the substrate is annealed to form a continuous second buried insulating layer 32 (hereinafter referred to as the second buried layer 32) within the lower substrate 30a adjacent to the first buried layer 31, as shown in FIG. 3C. The second buried layer 32, which preferably is largely, though not completely, contiguous to the planar first buried layer 31, departs from planarity only at a dip (below the exposed area of the first buried layer) which reflects the hole 33b through the upper substrate. (Adjacent structures and contiguous structures both mean structures in close proximity. Adjacent may or may not imply contact but always implies absence of anything of the same kind in between, while contiguous implies having contact on all or most of one side.) The oxygen (nitrogen) beam incident on the substrate encounters a nonuniform target, since a hole 33b has already been etched through the upper substrate 30b. Given an incident beam sufficiently energetic to pass through the first buried layer, the beam will clearly penetrate more deeply into the region of the lower substrate 30a below the hole 33b through the upper substrate and thus form the dip shown in FIG. 3C.

The energy of the second oxygen (nitrogen) implant is preferably the lowest energy consistent with the heretofore implicit requirement that the second buried layer 32 bound from below the first buried layer 31. The dose of the second oxygen (nitrogen) implant is then chosen to ensure that the second buried layer 36 is continuous wherever it departs from planarity and thus electrically isolates the region of the lower substrate 30a which lies above the second buried layer (and which, after being doped in a subsequent process step, will become the lower doped region 34a) from the region of the lower substrate which lies below the second buried layer.

Although implantation parameters for fabrication of a continuous, stoichiometric buried oxide layer are readily found in the prior art, much less information is available concerning masked implantations of oxygen. The most illusive such parameter is clearly the minimum dose required to ensure continuity of the second buried oxide layer wherever the layer departs from planarity. As mentioned above, implant energies of 150–200 keV and doses of $1-2\times10^{18}$ cm$^{-2}$ are typically required to form a good-quality, continuous, planar, buried oxide layer. For implant energies in the range 170–180 keV, scanning electron microscopy shows that a dose of $5\times10^{18}$ cm$^{-2}$ would suffice to form a good-quality, continuous, second buried layer with a mean planar thickness of 200 nm.

Figure 3D:
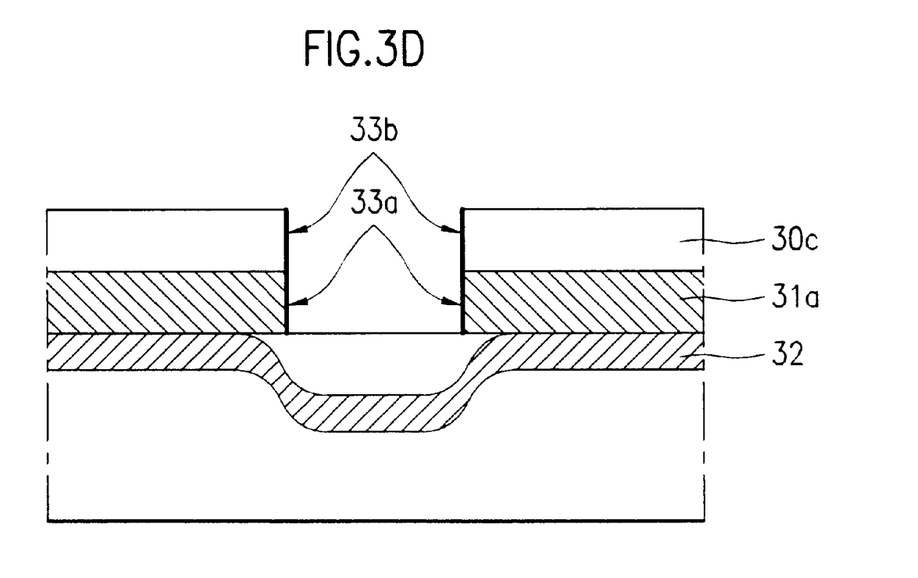

Masked by the etched upper substrate 30c, the first buried layer 31 is selectively etched until an area of the lower substrate is exposed, as shown in FIG. 3D. Etching the first buried layer 31 also exposes lateral surfaces 33a of the first buried layer, which collectively define a hole 33a through the first buried layer substantially aligned with the hole 33b through the upper substrate, and thereby forms an etched first buried layer 31a.

Figure 3E:
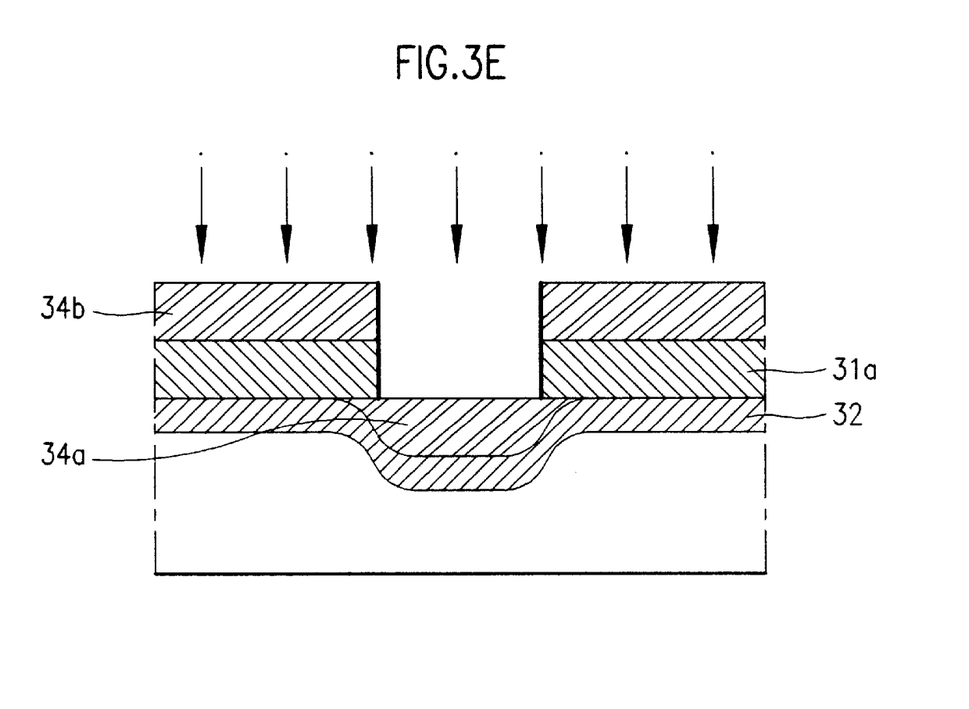

As shown in FIG. 3E, dopants of a first conductivity type are implanted into the substrate and the substrate is then annealed to form: a lower doped region 34a of the first conductivity type within the lower substrate 30a below the hole 33a through the first buried layer and above the dip in the second buried layer 32; and upper doped reaions 34b of the first conductivity type within the upper substrate 30a to either side of the hole 33b throuoh the upper substrate. The second buried layer 32 thus bounds from below both the first buried layer 31 and the lower doped region 34a.

The effect of the three process steps immediately preceding (i.e., the process steps illustrated by FIGS. 3C–3E, in that order) may alternatively be accomplished by taking these steps in essentially reverse order, as described in the three paragraphs immediately following.

After the upper substrate 30a has been selectively etched (but before the first photoresist pattern PR1 has been stripped), dopants of the first conductivity type man be implanted into the substrate to form: the lower doped reaion 34a of the first conductivity type within the lower substrate 30a below the hole 33b through the upper substrate; and the upper doped regions 34b of the first conductivity type within the upper substrate 30b to either side of the hole 33b through the upper substrate.

After the first photoresist pattern PR1 has been stripped, oxygen (nitrogen) may be implanted into the substrate and the substrate annealed to form the continuous second buried layer 32 within the lower substrate 30a adjacent to the first buried layer 31.

Masked by the etched upper substrate 30c, the first buried layer 31 may be selectively etched until the area of the lower substrate and the lateral surfaces 33a of the first buried layer are exposed.

The process sequence described in the three paragraphs immediately preceding, in the order given, may be interchanged with the process sequence illustrated by FIGS. 3C–3E, in that order, provided that the resistance offered by the (amorphous) first photoresist pattern PR1 to an incident beam of dopants of the first conductivity type is substantially the same as that offered by the (amorphous) first buried layer 31.

Figure 3F:
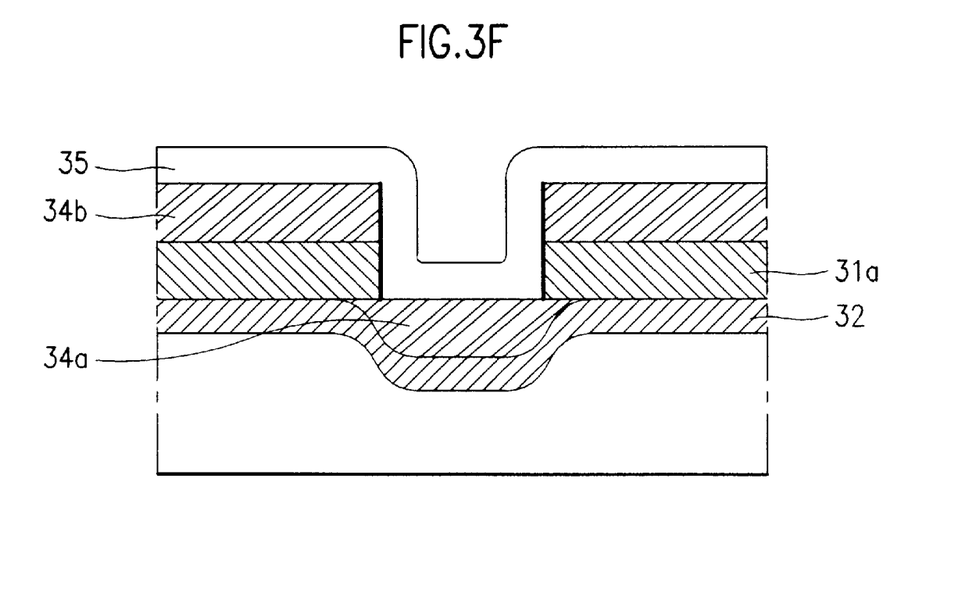
Figure 3G:
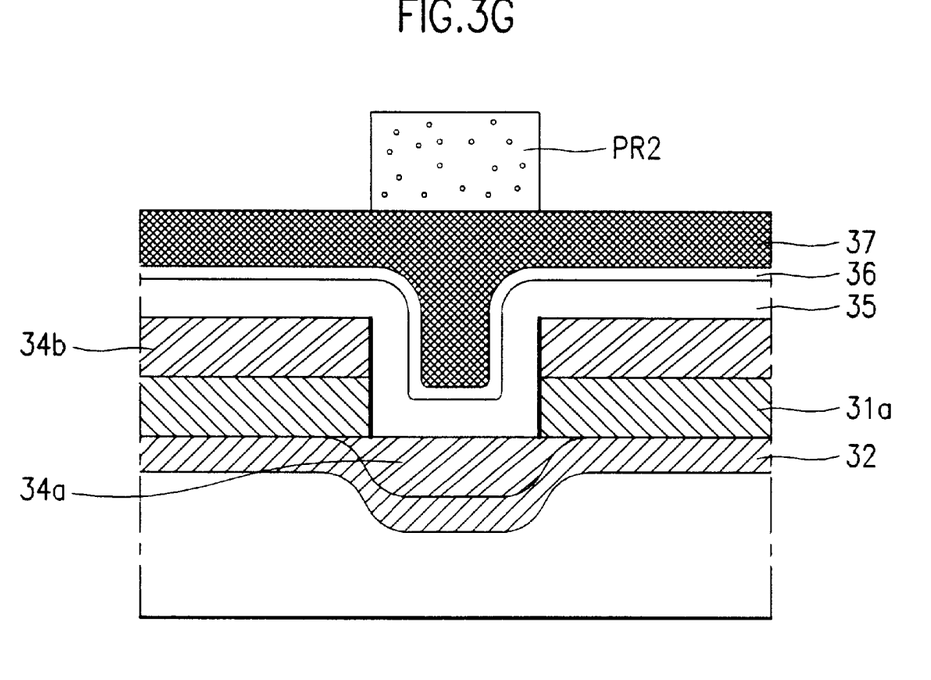

As shown in FIG. 3F, an epitaxial layer 35 roughly as thick as the first buried layer is grown on the exposed area of the lower substrate above the lower doped region 34a and on the exposed horizontal and lateral surfaces of the etched upper substrate 30c. Regions of the epitaxial layer 35 which are grown on the exposed lateral surfaces 33b of the etched upper substrate 30c and on the exposed surface of the lower substrate 30a above the lower doped region 34a merge to form a trench above the lower doped region 34a. Regions of the epitaxial layer 35 over the lower and upper doped regions will serve as the channel and source/drain regions, respectively, of the silicon-on-insulator MOSFET to be fabricated according to the method of the present invention.

After a conformal insulating film 36 has been deposited onto the epitaxial layer 35, a conductive material is deposited onto the conformal insulating film 36 and then planarized to form a conductive layer 37, as shown in FIG. 3F. Regions of the insulating film 36 deposited onto the surfaces of the trench formed by the epitaxial layer 35 above the lower doped region 34a comprise a trench liner and thus define a lined trench. A photoresist coating is spun onto the substrate and patterned by means of conventional exposure and development process steps to form a second photoresist pattern PR2 that is substantially the complement of the first photoresist pattern PR1. That is, the second photoresist pattern PR2 masks the hole 33b through the upper substrate, while the first photoresist pattern masks the etched upper substrate 30c to either side of the hole 33b through the upper substrate.

Figure 3H:
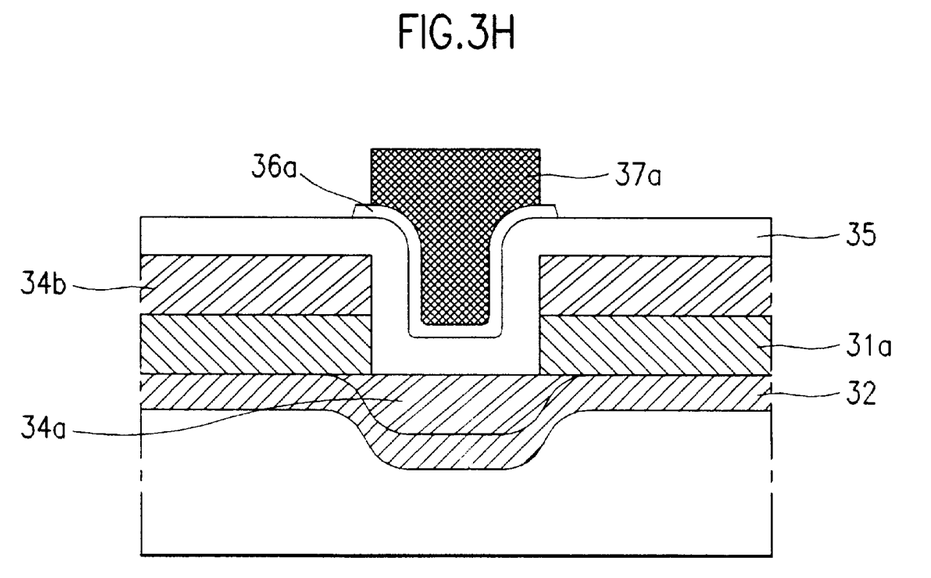

Masked by the second photoresist pattern PR2, the conductive layer 37 and the conformal insulating film 36 are selectively etched to form a gate electrode 37a (which fills the lined trench) and a gate insulator 36a, respectively, above the lower doped region 34a as shown in FIG. 3H.

Figure 3I:
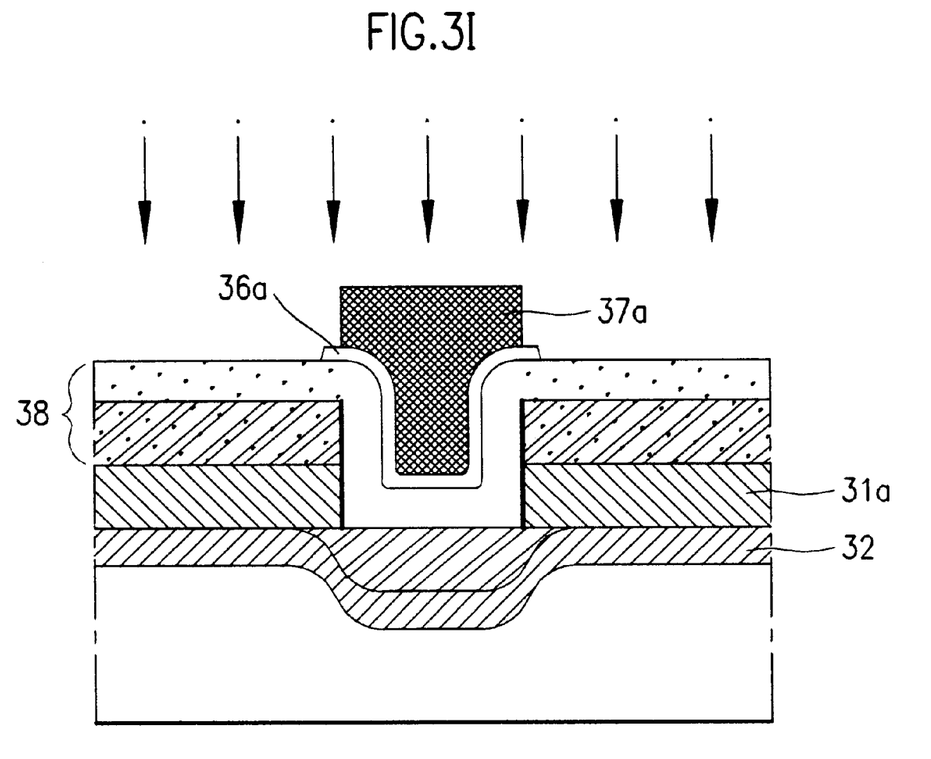

After the second photoresist pattern PR2 has been stripped, dopants of a second conductivity type are selectively implanted into the substrate, which is masked by the gate electrode 37a, to form lightly-doped source/drain regions 38b of the second conductivity type within both the upper substrate and the epitaxial layer to either side of the trench, as shown in FIG. 3I. Less energetic dopants of the second conductivity type are then implanted into the substrate and the substrate is annealed to form heavily-doped source/drain regions 38a of the second conductivity type above the lightly-doped source/drain regions. (Alternatively. the source/drain regions of the second conductivity type may be formed within the epitaxial layer and the upper substrate to either side of the trench by means of diffusion, rather than ion implantation.)

A heavily-doped body contact region (not shown) of the first conductivity type is formed by either diffusion or ion implantation within a region of the lower doped region 34a that does not lie below the gate electrode 37a. (The body contact region does not appear in FIG. 3 because the cross-sectional views of FIG. 3 show only reoions of the lower doped region that lie below the gate electrode. A cross-sectional view which would show the body contact region would thus be out-of-the-page or into-the-page with respect to the cross-sectional views of FIGS. 3.) The body contact region, which, in the according to the present invention, is the avenue by which holes can escape from the lower doped region rather than from the upper substrate, does not increase area occupied by the MOSFET, much like the back-surface body contact of a lightly-doped bulk silicon substrate.

The embodiments described above are intended to illustrate the invention, but not to exhaustively delineate every detail of the invention as practiced. It will be apparent to those skilled in the art of silicon-on-insulator MOSFET fabrication that various modifications can be made to the method and apparatus of the present invention without departing from the spirit of the invention. The present invention is thus intended to cover such modifications provided they come within the scope of the appended claims and their equivalents.

What is claimed is:

1. A silicon-on-insulator semiconductor device comprising:
    a silicon substrate;
    a continuous first buried insulating layer within the substrate, the first buried layer defining an upper substrate above the first buried layer and a lower substrate below the first buried layer, the upper substrate having a hole, the first buried layer having a hole substantially aligned with the hole through the upper substrate;
    a lower doped region of a first conductivity type within the lower substrate below the hole through the first buried layer;
    a continuous second buried insulating layer within the lower substrate, the second buried layer bounding from below the lower doped region;
    upper doped regions of the first conductivity type within the upper substrate to either side of the hole through the upper substrate;
    a epitaxial layer on the upper substrate and on the lower substrate over the lower doped region, regions of the epitaxial layer over the lower doped region forming a trench;
    conformal insulating film lining the trench;
    a conductive layer on the conformal insulating film; and
    doped regions of a second conductivity type within both the upper substrate and the epitaxial layer to either side of the trench.

2. The silicon-on-insulator semiconductor device according to claim 1, wherein the doped regions of a second conductivity type include lightly-doped regions of the second conductivity type within both the upper substrate and the epitaxial layer to either side of the trench and heavily-doped regions of the second conductivity type above the lightly-doped regions.

3. The silicon-on-insulator semiconductor device according to claim 2, further comprising a heavily-doped body contact region of the first conductivity type within the lower doped region.

4. The silicon-on-insulator semiconductor device according to claim 1, further comprising a heavily-doped body contact region of the first conductivity type within the lower doped region.

5. A method of fabricating a silicon-on-insulator semiconductor device on a silicon substrate having a continuous first buried insulating layer within the substrate, the layer defining an upper substrate above the first buried layer and a lower substrate below the first buried layer, the method comprising the steps of:
    selectively etching the upper substrate until an area of the first buried layer is exposed, thereby forming a hole through the upper substrate;
    implanting oxygen or nitrogen into the substrate and then annealing the substrate to form a continuous second buried insulating layer within the lower substrate;
    selectively etching the first buried layer until an area of the lower substrate is exposed, thereby forming a hole through the first buried layer substantially aligned with the hole through the upper substrate;
    implanting dopants of a first conductivity type into the substrate and then annealing the substrate, thereby forming upper doped regions of the first conductivity type within the upper substrate to either side of the hole through the upper substrate and a lower doped region of the first conductivity type within the lower substrate above the second buried layer;
    growing an epitaxial layer on the etched upper substrate and on the exposed area of the lower substrate, regions of the epitaxial layer over the lower doped region thereby forming a trench;
    depositing a conformal insulating film onto the trench;
    forming a conductive layer on the conformal insulating film; and forming doped regions of a second conductivity type within both the upper substrate and the epitaxial layer to either side of the trench, thereby fabricating the silicon-on-insulator semiconductor device.

6. The method according to claim 5, wherein the doped regions of a second conductivity type include lightly-doped regions of the second conductivity type within both the upper substrate and the epitaxial layer to either side of the trench and heavily-doped regions of the second conductivity type above the lightly-doped regions.

7. The method according to claim 5, further comprising the step of forming a heavily-doped body contact region of the first conductivity type within the lower doped region.

8. The method according to claim 6, further comprising the step of forming, a heavily-doped body contact region of the first conductivity type within the lower doped region.

9. A method of fabricating, a silicon-on-insulator semiconductor device on a silicon substrate, the method comprising the steps of forming a continuous first buried insulating layer within the substrate, thereby defining an upper substrate above the first buried layer and a lower substrate below the first buried layer;

selectively etching the upper substrate until an area of the first buried layer is exposed, thereby forming a hole through the upper substrate;

implanting oxygen or nitrogen into the substrate and then annealing the substrate to form a continuous second buried insulating layer within the lower substrate;

selectively etching the first buried layer until an area of the lower substrate is exposed, thereby forming a hole through the first buried layer substantially aligned with the hole through the upper substrate;

implanting dopants of a first conductivity type into the substrate and then annealing the substrate, thereby forming upper doped regions of the first conductivity type within the upper substrate to either side of the hole through the upper substrate and a lower doped region of the first conductivity type within the lower substrate above the second buried layer;

growing an epitaxial layer on the etched upper substrate and on the exposed area of the lower substrate, regions of the epitaxial layer over the lower doped region thereby forming a trench;

depositing a conformal insulating film onto the trench;

forming a conductive layer on the conformal insulating film; and forming doped regions of a second conductivity type within both the upper substrate and the epitaxial layer to either side of the trench, thereby fabricating the silicon-on-insulator semiconductor device.

10. The method according to claim 9, wherein the doped regions of a second conductivit type include lightly-doped regions of the second conductivity type within both the upper substrate and the epitaxial layer to either side of the trench and heavily-doped regions of the second conductivity type above the lightly-doped regions.

11. The method according to claim 10, further comprising the step of forming a heavily-doped body contact region of the first conductivity type within the lower doped region.

12. The method according to claim 9, further comprising the step of forming a heavily-doped body contact region of the first conductivity type within the lower doped region.

13. A method of fabricating a silicon-on-insulator semiconductor device on a silicon substrate, the method comprising the steps of:

forming a continuous first buried insulating layer within the substrate, thereby defining an upper substrate above the first buried layer and a lower substrate below the first buried layer;

selectively etching the upper substrate until an area of the first buried layer is exposed, thereby forming a hole through the upper substrate;

implanting dopants of a first conductivity type into the substrate, thereby forming upper doped regions of the first conductivity type within the upper substrate to either side of the hole through the upper substrate and a lower doped region of the first conductivity type within the lower substrate below the hole through the upper substrate;

selectively etching the first buried layer until an area of the lower substrate is exposed, thereby forming a hole through the first buried layer substantially aligned with the hole through the upper substrate;

implanting oxygen or nitrogen into the substrate and then annealing the substrate to form a continuous second buried insulating layer within the lower substrate, the second buried layer bounding from below the lower doped region;

growing an epitaxial layer on the etched upper substrate and on the exposed area of the lower substrate, regions of the epitaxcial layer over the lower doped region thereby forming a trench;

depositing a conformal insulating film onto the trench;

forming a conductive layer on the conformal insulating film, and forming doped regions of a second conductivity type within both the upper substrate and the epitaxial layer to either side of the trench, thereby fabricating the silicon-on-insulator semiconductor device.

14. The method according to claim 13, wherein the doped regions of a second conductivity type include lightly-doped regions of the second conductivity type within both the upper substrate and the epitaxial layer to either side of the trench and heavily-doped regions of the second conductivity type above the lightly-doped regions.

15. The method according to claim 14, further comprising the step of forming, a heavily-doped body contact region of the first conductivity type within the lower doped region.

16. The method according to claim 13, further comprising the step of forming a heavily-doped body contact region of the first conductivity type within the lower doped region.

17. A method of fabricating a silicon-on-insulator semiconductor device on a silicon substrate having a continuous first buried insulating layer within, the layer defining an upper substrate above the first buried layer and a lower substrate below the first buried layer, the method comprising the steps of:

selectively etching the upper substrate until an area of the first buried layer is exposed, thereby forming a hole through the upper substrate;

implanting dopants of a first conductivity type into the substrate, thereby forming upper doped regions of the first conductivity type within the upper substrate to either side of the hole through the upper substrate and a lower doped region of the first conductivity type within the lower substrate below the hole through the upper substrate;

selectively etching the first buried layer until an area of the lower substrate is exposed, thereby forming a hole through the first buried layer substantially aligned with the hole through the upper substrate;

implanting oxygen or nitrogen into the substrate and then annealing the substrate to form a continuous second buried insulating layer within the lower substrate, the second buried layer bounding from below the lower doped region;

growing an epitaxial layer on the etched upper substrate and on the exposed area of the lower substrate, regions of the epitaxial layer over the lower doped region thereby forming a trench;

depositing a conformal insulating film onto the trench;

forming a conductive layer on the conformal insulating film; and forming doped regions of a second conductivity type within both the upper substrate and the epitaxial layer to either side of the trench, thereby fabricating the silicon-on-insulator semiconductor device.

18. The method according to claim 17, wherein the doped regions of a second conductivity type include lightly-doped regions of the second conductivity type within both the upper substrate and the epitaxial layer to either side of the trench and heavily-doped regions of the second conductivity type above the lightly-doped regions.

19. The method according to claim 18, further comprising the step of forming a heavily-doped body contact region of the first conductivity type within the lower doped region.

20. The method according to claim 17, further comprising the step of forming a heavily-doped body contact region of the first conductivity type within the lower doped region.

* * * * *